United States Patent [19]

Miura

[11] Patent Number: 4,713,579

[45] Date of Patent: Dec. 15, 1987

[54] DOT MATRIX LUMINOUS DISPLAY

[75] Inventor: Masanobu Miura, Osaka, Japan

[73] Assignee: Takiron Co., Ltd., Osaka, Japan

[21] Appl. No.: 796,829

[22] Filed: Nov. 12, 1985

[30] Foreign Application Priority Data

Nov. 12, 1984 [JP] Japan ........................... 59-171487[U]
Apr. 5, 1985 [JP] Japan ........................... 60-51480[U]

[51] Int. Cl.$^4$ ........................................ H01L 33/00

[52] U.S. Cl. .................................. 313/500; 313/505; 313/511; 313/512

[58] Field of Search ................ 313/500, 511, 512, 505

[56] References Cited

U.S. PATENT DOCUMENTS 3,590,252 6/1971 Lake ................................ 313/505 X
4,000,437 12/1976 Lederhandler et al. ............ 313/500
4,007,396 2/1977 Wisbey et al. ...................... 313/500
4,241,277 12/1980 Hintze et al. ....................... 313/500
4,485,377 11/1984 Claus et al. ...................... 313/500 X
4,603,496 8/1986 Latz et al. ........................ 313/500 X

FOREIGN PATENT DOCUMENTS 0083196 6/1980 Japan .................................. 313/512

*Primary Examiner*—Palmer C. DeMeo
*Attorney, Agent, or Firm*—Sughrue, Mion, Zinn, Macpeak & Seas

[57] ABSTRACT

A dot matrix type luminous display in which flaws such as strains are substantially eliminated during the manufacturing process. A display board bearing light-emitting elements is covered by a flexible member having through-holes formed at locations corresponding to the light-emitting elements. These through-holes, which are filled with a heat-resistant, translucent resin, are offset from through-holes formed in the display board, which are used to provide electrical connections to the light-emitting elements.

16 Claims, 13 Drawing Figures

DOT MATRIX LUMINOUS DISPLAY

BACKGROUND OF THE INVENTION

The present invention relates to improvements in dot-matrix luminous displays constructed of luminous elements such as light-emitting diodes.

Luminous displays of this type are designed to display desired characters, symbols or patterns in the form of a dot pattern by supplying power to and lighting selected luminous elements arranged in a matrix.

The basic structure of such a matrix display includes upper and lower electrodes arranged in a three-dimensional matrix with an insulating layer sandwiched therebetween, and semiconductor chips disposed at intersections between the upper and lower electrodes.

Referring to FIGS. 1 and 2, the general structure of such a matrix display will be described. Two sheets of insulating substrates 102 and 103, respectively bearing parallel rows of upper electrodes 100 and lower electrodes 101 on their surfaces, are coupled together to form a matrix luminous display board (hereinafter referred to as simply a "matrix board" or "display board") 1 with the upper and lower electrodes 100 and 101 arranged in a three-dimensional matrix. There are provided through-holes 104 in portions where the upper and lower electrodes 100 and 101 intersect. A semiconductor chip 105, forming a single luminous element, is supplied in each through-hole 104, and, as a final process, the entire surface of the matrix board 1, including the through-holes 104 through which are exposed the semiconductor chips 105, is coated with a translucent thermosetting resin to provide thereby a continuous protective film 107. In addition, bonding wires 106 are used to connect the semiconductor chips 105 to the upper electrodes 100, whereas solder or silver paste 108 is used to provide conductive connection between the bottoms of the semiconductor chips 105 and the lower electrodes 101.

Typically, the spacing between outer edges of adjacent through-holes 104 is about 8.0 mm, the diameter of each through-hole 104 is about 6.5 mm, and the length of a side of the display board 1, is about 64 mm. However, during the process of manufacturing such matrix boards, specifically, when the boards are coated with the translucent thermosetting resin film 107, there may be produced strain, camber, peeling and cracks (hereinafter collectively referred to as "flaws such as strains") at the joints of the matrix board 1 and the protective film 107 because of the difference therebetween in the coefficient of thermal expansion. These flaws such as strains result in defective products.

Moreover, the flaws such as strains become more pronounced as the size of the matrix board 1 is increased. Even finished products are not free from such strains caused by, for instance, the temperature difference between summer and winter or heat generated when power is supplied to the luminous elements.

SUMMARY OF THE INVENTION

The present invention is intended to solve the aforementioned problems.

It is a specific object of the invention to provide a dot matrix luminous display arranged so as to prevent, with a simplified construction, the development of flaws such as strains resulting from the difference in the coefficient of thermal expansion between the above-described materials.

In order to solve the aforementioned problems, the inventive dot matrix luminous display is composed of a dot matrix luminous display board having luminous elements arranged at intersections between upper and lower electrodes arranged in a three-dimensional matrix with an insulating layer sandwiched therebetween, and a flexible plate with through-holes at locations corresponding to the luminous elements joined to the surface of the dot matrix luminous display board.

The dot matrix luminous display according to the present invention is structurally characterized in that the flexible plate with through-holes at locations corresponding to the luminous elements arranged on the board is joined to the surface thereof. As a result, the following functions and effects are provided:

(1) The flexible plate fixed to the surface of the matrix board can be used as part of the protective film for the board, whereby the luminous elements are encapsulated by pouring the translucent thermosetting resin in each through-hole in the flexible plate to protect the luminous elements from the external environment.

(2) The thermosetting resin (forming a protective film for the luminous elements) is prevented from becoming a continuous film when the protective film for the luminous elements is formed, and, because the through-holes are individually filled with the thermosetting resin, the difference in the coefficients of thermal expansion between the matrix board and the thermosetting resin will affect the structure to the least extent.

Further, the flexible plate can distort and expand freely, due to its inherent flexibility, during the manufacturing process, specifically, when the matrix boards are heated to form protective thermosetting resin films, and consequently the development of flaws such as strains, which may be caused by the undesired effects of shrinkage of the thermosetting resin upon curing, are prevented. Even when the finished products are heated, the development of flaws such as strains is effectively prevented.

In the dot matrix luminous display according to the present invention, because the formation of flaws such as strain is suppressed, not only has it become possible to improve the manufacturing productivity of these matrix displays, but also the size of the dot matrix luminous displays can be increased.

(3) With the inventive structure, the matrix board with the flexible plate joined thereto can be manufactured inexpensively.

(4) Because the flexible plate joined to the surface of the matrix board has through-holes corresponding in location to the luminous elements and because the protective film is formed by pouring translucent thermosetting resin into the through-holes in the flexible plate when the protective film is formed for the luminous elements, no difficulty occurs in providing the matrix board with a side frame when the protective film is formed, which facilitates the production of such luminous displays.

(5) The flexible plate having through holes has such functions that an occurrence of undesired diffused light and leakage of light to neighboring portions can be possitively prevented, a virtual diameter of a dot pattern can be increased and contours of the dot pattern can be made clear whereby the dot matrix luminous display can be improved in visual characteristics.

DESCRIPTION OF THE PREFERRED EMBODIMENTS

Referring now to the accompanying drawings, a dot matrix luminous display embodying the present invention will be described.

Figure 3:
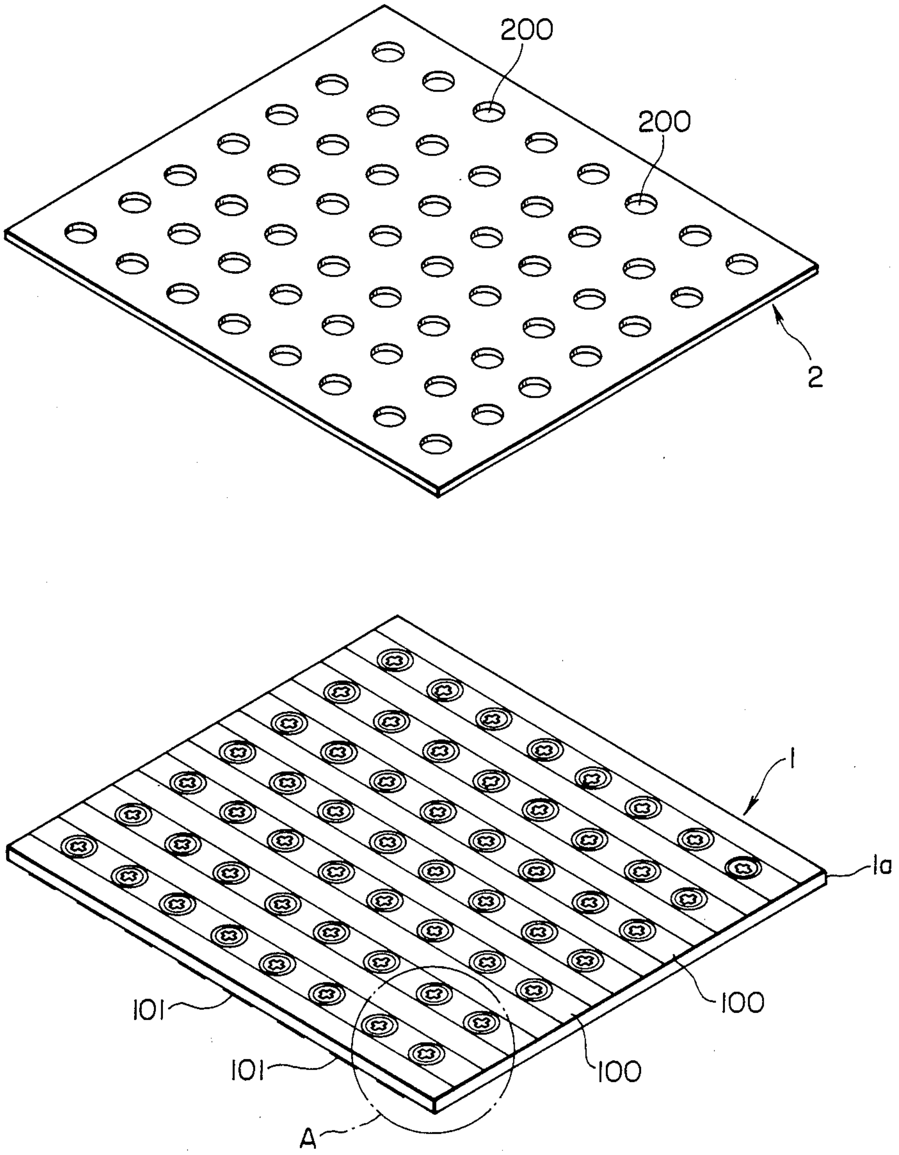
FIG. 3 is a schematic exploded view of a matrix board and an flexible plate illustrating a dot matrix luminous display embodying the present invention.
Figure 4:
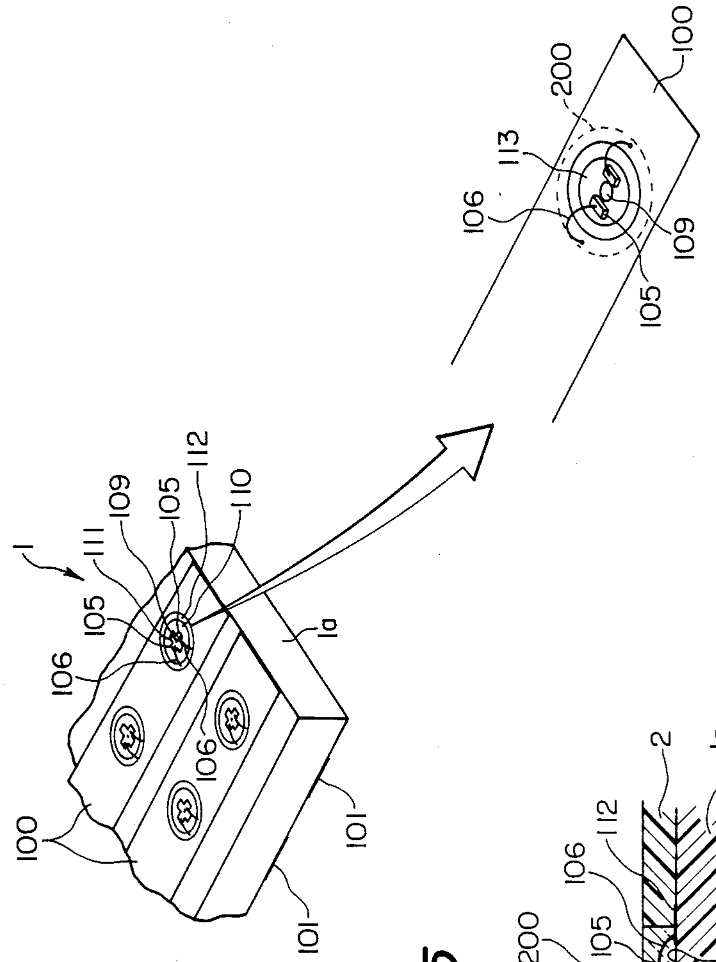
FIG. 4 is an enlarged view of a portion A in FIG. 3.
Figure 5:
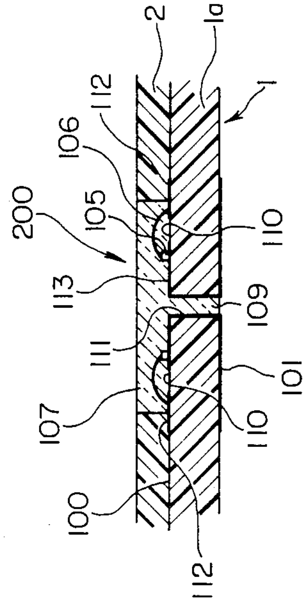
FIG. 5 is an enlarged vertical sectional view of the display of FIG. 3.

FIG. 3 is a schematic exploded view illustrating a matrix luminous display according to the present invention. FIG. 4 is an enlarged view of a portion A indicated in FIG. 3. FIG. 5 is a vertical sectional view illustrating principal portions with the flexible plate joined.

As shown in these drawings, the luminous display according to the present invention includes the flexible plate 2 with through-holes 200 provided therein joined to the surface of the matrix board 1. The flexible plate 2 is prepared from a flexible material.

To construct this display, first an etching process is applied to the top and bottom faces of a glass epoxy laminated plate, to the top and bottom faces of which have been adhered copper foil, to remove undesired portions of the copper foil so as to provide upper electrodes 100 and lower electrodes 101 arranged in a three-dimensional matrix, including cross conductive portions 111. The cross conductive portions 111 are provided inside respective insulating portions 110, formed in a part of the upper electrode 100 above the lower electrodes 101, and are coupled to the lower electrodes 101 through respective through-holes 109 provided in the center of the insulating portions 110. The surface of each cross conductive portion 111 is plated, and a portion surrounding the cross conductive portion 111 is plated to form a conductive portion 113.

Figure 1:
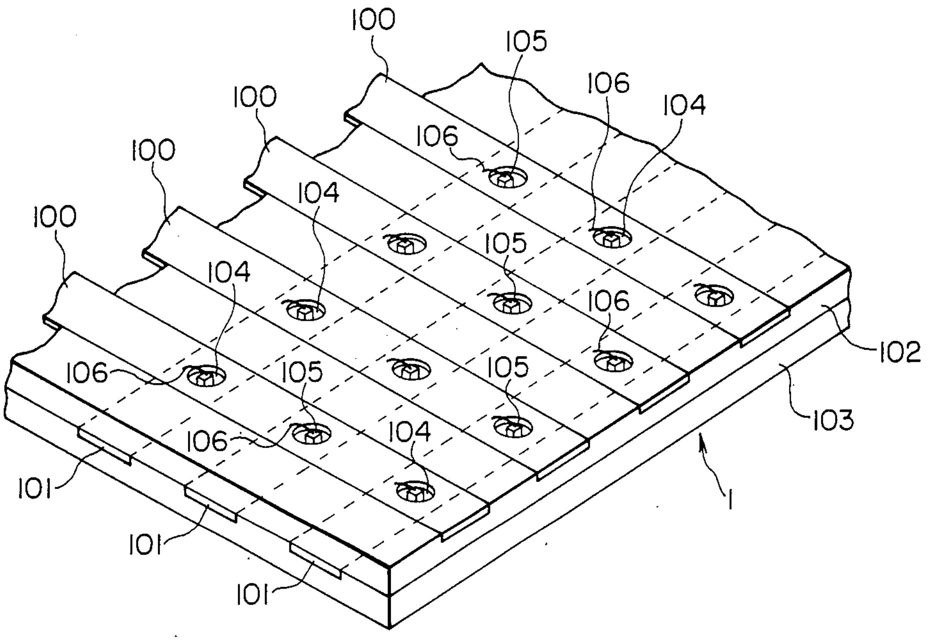
FIG. 1 PRIOR ART
FIG. 1 is a perspective view illustrating the basic construction of a dot matrix luminous display.
Figure 2:
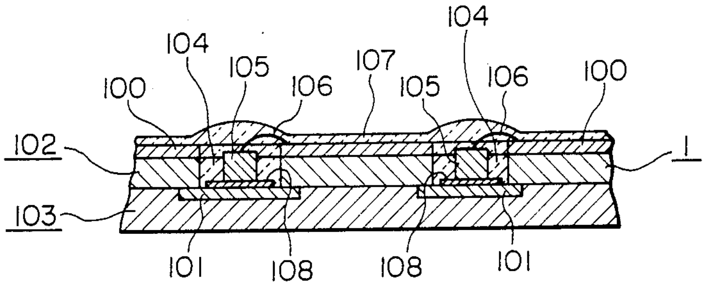
FIG. 2 PRIOR ART
FIG. 2 is a partially enlarged vertical sectional view of the display of FIG. 1.

Although a print circuit board having a glass epoxy laminated plate as a substrate is described as the material of the matrix board 1 in this embodiment, the material is not particularly restricted and, for instance, a paper phenol laminated plate lined with copper and a composite plate as shown in FIG. 1 can be used.

The lower surfaces of semiconductor chips 105, used as the luminous elements are fixed with silver paste (not shown) to the conductive portion 113, whereas the upper surfaces of the semiconductor chips 105 are bonded by wires 106 to a plated portion 112 of the upper electrode 100.

Well known types of pn junction light-emitting diodes, such as those of the gallium phosphorus (GaP) type, gallium arsenic (GaAs) type, gallium aluminum arsenic (GaAlAs) type etc., are preferably employed for the semiconductor chips 105 constituting the luminous elements used in the present invention, but other types may be used as well.

As aforementioned, the flexible plate 2 prepared from a flexible material is provided with through-holes 200 at locations corresponding to the semiconductor chips 105 arranged on the matrix board 1. The material used to prepare the flexible plate 2 is preferably one of silicon rubber, neoprene rubber, flexible epoxy resin, or flexible acrylic resin, and most preferably a heat resistant material.

It is also preferred to apply white or silver paint to the inside surface of each through-hole 200 to improve the luminous flux radiated from the luminous element 105 and to obtain clearer light emission by preventing light from leaking to neighboring portions. Particularly, it is preferred to form the flexible plate 2 itself of a white material having an excellent light reflection efficiency. Accordingly, the finished dot matrix luminous display thus constructed is obtained by joining the flexible plate 2 to the surface of the matrix board 1, pouring translucent thermosetting resin into each through-hole 200 in the flexible plate 2, then thermosetting the resin to form a protective film 107 (see FIG. 5).

To operate the dot matrix luminous display, positive and negative driver terminals are respectively connected to the upper electrode 100 and the lower electrode 101, and a dynamic drive circuit is used to display desired characters, symbols and patterns in the form of a dot patterns by selectively supplying power to and lighting the luminous elements 105 by the selection of combinations of electrodes, as is well known.

With such a dot matrix luminous display as shown in FIGS. 3 through 5, since the portions of the through-holes 109 and 200 coincide with each other, it is preferable to previously fill the through-holes 109 with solder or silver paste in order to prevent the leakage of thermosetting resin to a backside of the display. In order to eliminate the above problem accompanying the display of FIGS. 3 through 5, it is considered that the through-holes in the display board are provided in areas other than those where the through-holes in the flexible plate are made.

Another embodiment of the present invention, which is provided with offset through-holes to eliminate the problem accompanying the embodiment of FIGS. 3 through 5, will now be described.

Figure 6:
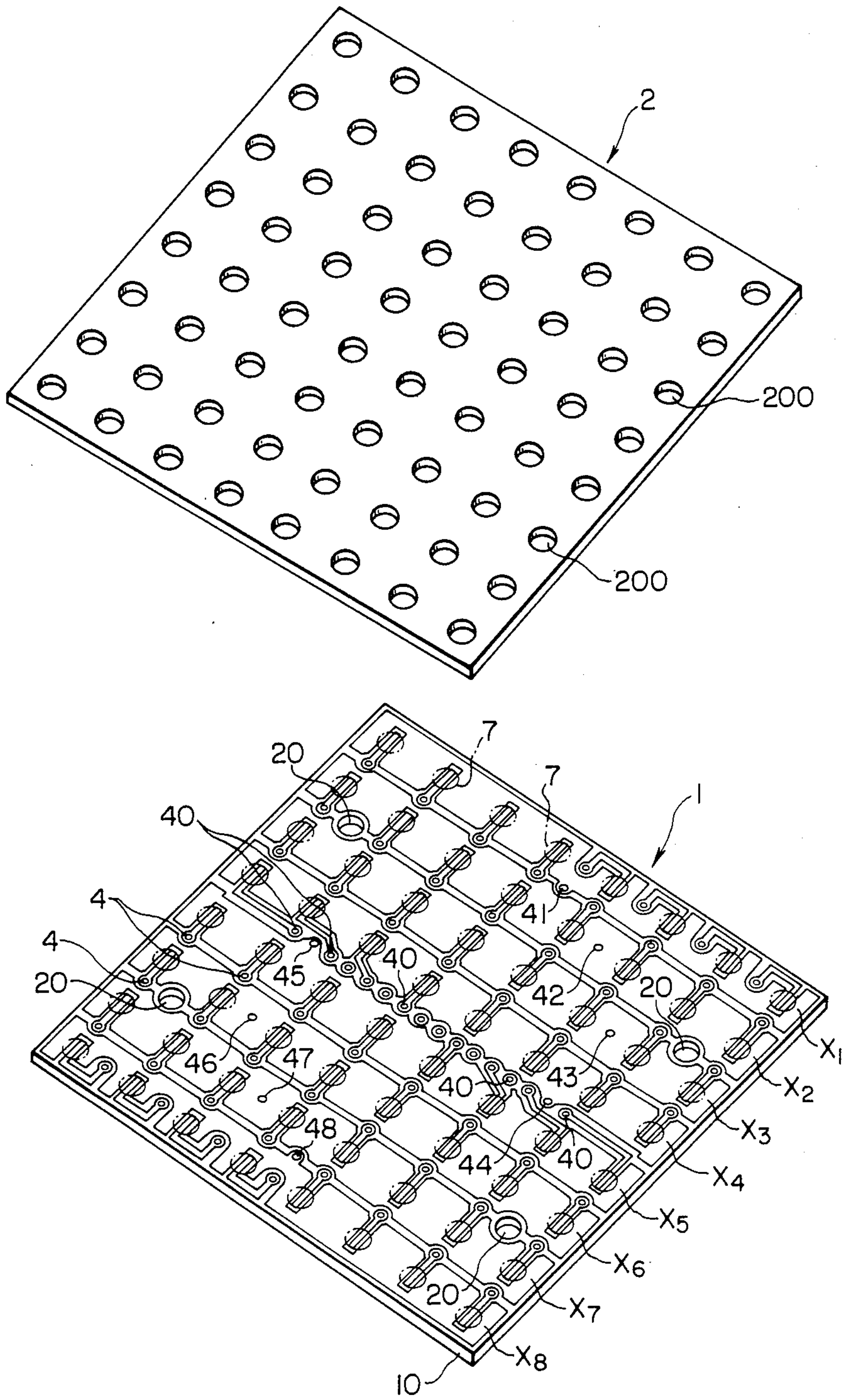
FIG. 6 is a perspective exploded view of another embodiment of the present invention.

FIG. 6 is a perspective exploded view illustrating an application of the present invention to a 8×8 dot matrix luminous display, which includes a display board 1, luminous portions 7 formed by semiconductor chips such as light-emitting diodes, and an flexible plate 2 provided with through-holes 200 corresponding in location to the luminous portions 7.

As shown in FIG. 6, the display board 1 is provided with an electrode pattern (represented by X and Y electrodes in this case), formed by etching the top and bottom faces of a laminated plate lined with copper, and luminous portions 7 including semiconductor chips 7*a*, such as light-emitting diodes, fixed thereto. The luminous portions 7 are arranged in a matrix.

The following Table 1 shows a concrete example of a 8×8 dot matrix luminous display.

TABLE 1

| | |
|---|---|
| Side length of display board: | 64 mm |
| Diameter of through holes: | 6.5 mm |
| Spacing between through holes: | 8.0 mm |
| Thickness of matrix board: | 1.6 mm |
| Thickness of flexible plate: | 1.5 to 2.0 mm |

In the dot matrix luminous display plate thus constructed, because no through-holes are present in the display board in the areas of the luminous portions, the above described process of filling these holes is unnecessary when the through-holes in the flexible plate are filled with thermosetting resin. Thus, the manufacturing efficiency of the display is significantly improved.

That is, because the flexible plate has through-holes in locations corresponding to the luminous portions and not the through-holes in the display board, it is only necessary to fill the through-holes in the locations corresponding to the luminous portions with thermosetting resin and to harden the resin. Accordingly, since only those through-holes must be filled with the thermosetting resin, there is little likelihood of leakage from the backside of the display board.

In addition, a concrete example of 16×16 dot matrix luminous display is as shown in the following Table 2.

TABLE 2

| | |
|---|---|
| Side length of display board: | 64 mm |
| Diameter of through holes: | 3.0 mm |
| Spacing between through holes: | 4.0 mm |
| Thickness of matrix board: | 1.6 mm |
| Thickness of flexible plate: | 1.0 to 1.5 mm |

While two concrete examples are shown in the above Tables 1 and 2, there is no intention to limit the present invention thereto. According to experiments, the fact is established that as the side length of the display board increases, the effect of the present invention becomes remarkable. More specifically, the effect of the present invention is remarkable in case of the side length of the display board larger than 50 mm.

Figure 7:
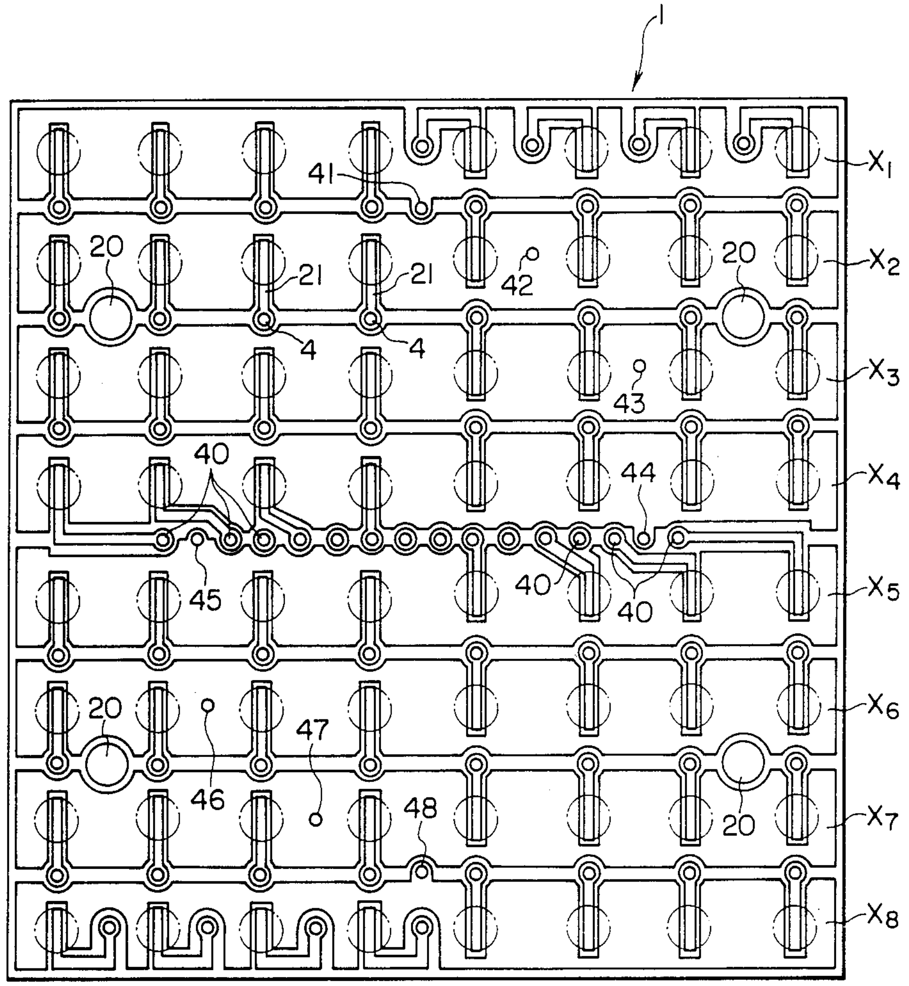
FIG. 7 is a diagram illustrating an electrode pattern arranged on the surface of the display board in the FIG. 6 embodiment.
Figure 8:
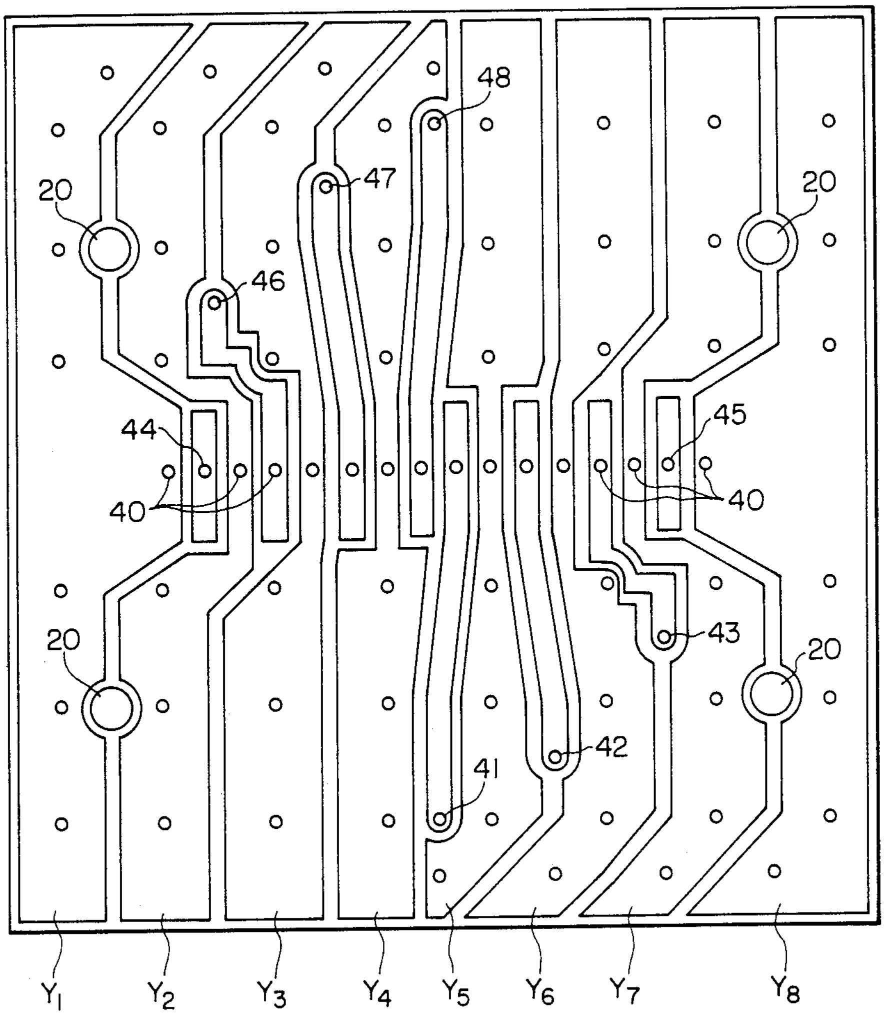
FIG. 8 is a diagram illustrating an electrode pattern arranged on the rear surface thereof.

FIG. 7 is a diagram illustrating the electrode pattern arranged on the surface of the display board 1. FIG. 8 is a diagram illustrating the rear side of the electrode pattern.

Referring to FIGS. 7 and 8, copper foil attached to the top and bottom faces of a laminated plate is etched to form electrodes X ($X_1$ to $X_8$) and Y ($Y_1$ to $Y_8$) for the display board 1.

In the center of the display board 1 there are formed sixteen through-holes 40, including through-holes 44 and 45, in a horizontal row where connector terminals are installed. The connector terminals on the electrode X and Y sides are alternately arranged. The connector terminals on the electrode X side are respectively connected to the electrodes X ($X_1$ to $X_8$) via through-holes 41 to 48, whereas those on the electrode Y side are respectively connected to vertically extending electrodes 21 via through-holes 4 corresponding to the luminous portions 7.

Figure 9:
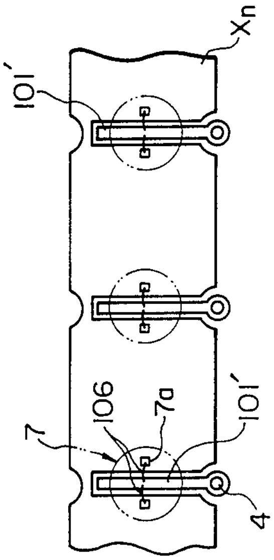
FIG. 9 is an enlarged top view of a luminous portion.

In FIGS. 6 through 11 the portions designated by alternate long and short dashed lines are the luminous portions 7 where the semiconductor chips 7*a* are installed. The luminous portions 7 are conductively plated and supplied with the semiconductor chips 7*a* by means of silver paste, the semiconductor chips 7*a* being wire-bonded to the vertically extending electrodes 21. FIG. 9 is an enlarged view of a luminous portion 7 in FIG. 6.

The flexible plate 2 is joined to the display board 1 in such a manner as to match the through-holes 200 thereof to the luminous portions 7 on the display board 1. Each of the through-holes 200 of the flexible plate 2 is filled with thermosetting resin (not shown) to complete the dot matrix luminous display. There are also shown fitting holes 20 in FIGS. 6 through 8 used to attach the display board 1 to a matrix drive circuit board (not shown).

To operate the display board 1 thus arranged, a connector (not shown) is fitted to the connected terminal, and then connected to a matrix drive circuit (not shown). The luminous portions 7 are then selectively supplied with power by driving selected combinations of the electrodes X and Y in such a manner that dot patterns in the form of desired characters or symbols are displayed.

Figure 10:
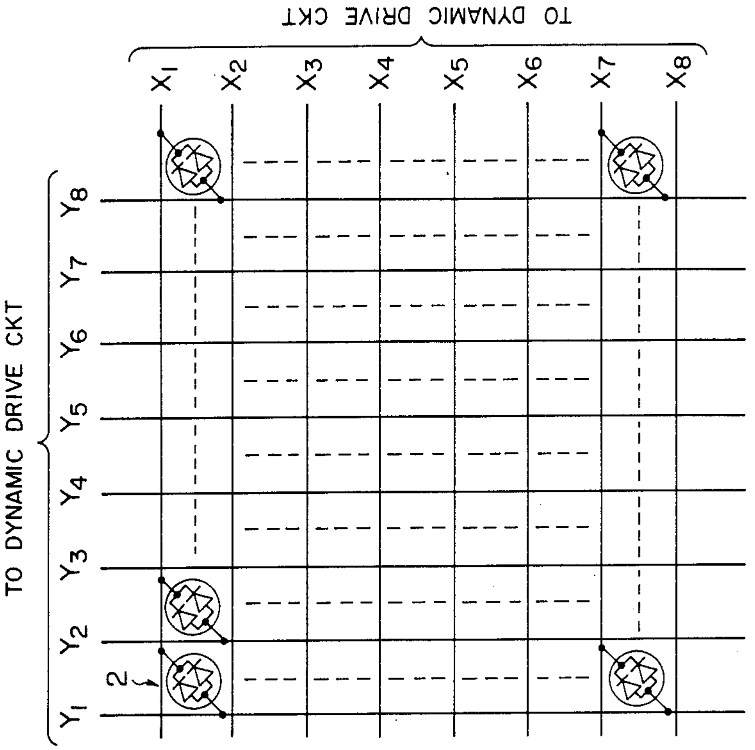
FIG. 10 is a diagram illustrating an example of an electrical equivalent circuit of the luminous display board of the FIG. 6 embodiment.

FIG. 10 shows an electrical equivalent circuit of the display board 1 with two semiconductor chips 7*a* (light-emitting diodes) connected to each luminous portion 7 in parallel.

Figure 11:
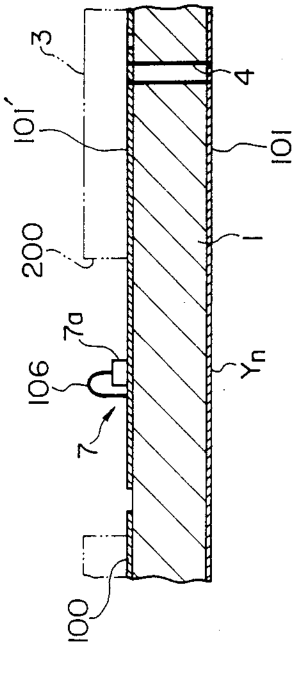
FIG. 11 is an enlarged structural vertical sectional view of the luminous portion corresponding to FIG. 9.

FIG. 11 illustrates the relationship of the display board 1 to the through-hole 200 of the flexible plate 2 in a vertical sectional structural diagram.

In the luminous display plate according to this embodiment of the present invention, no through-holes 4 are provided for the display board 1 in areas corresponding to the through-holes 200 of the flexible plate 2, and it will thus be readily understood that the through-holes 4 are formed in areas other than those where the through-holes 200 are made.

Figure 12:
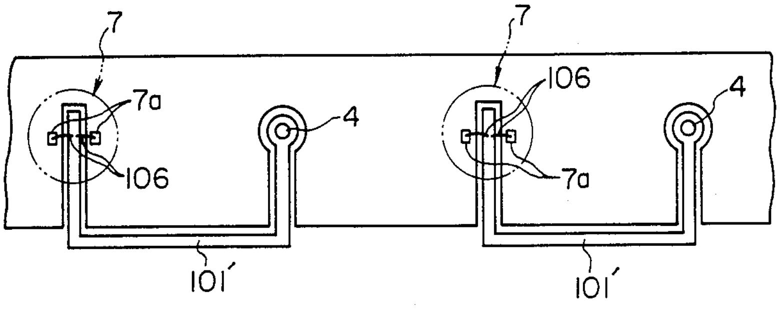
FIG. 12 is an enlarged top view of another luminous portion.

FIG. 12 is a diagram illustrating an electrode pattern of another example of the display board 1, wherein the through-hole 4 is made so that the semiconductor chips 7*a* bonded on the electrode X ($X_n$) are electrically wire-bonded to the electrode pattern 101' extending to the luminous portion 7, and consequently the through-hole 4 is seen to be provided in an area other than that where the through-hole 200 of the flexible plate 2 is made.

As set forth above, the present invention is characterized in that the through-holes 4 and 40 to 48 are provided in areas other than those corresponding to the through-holes 200 of the flexible plate 2.

Substantially any structure of the flexible plate 2 is acceptable, but it is preferred, as in the case of the first-described embodiment, to prevent the formation of strains and cracks by employing a material whose coefficient of thermal expansion conforms to that of the display board 1, or one prepared from a flexible resin, if the flexible plate 2 is selected in terms of its structural properties.

Figure 13:
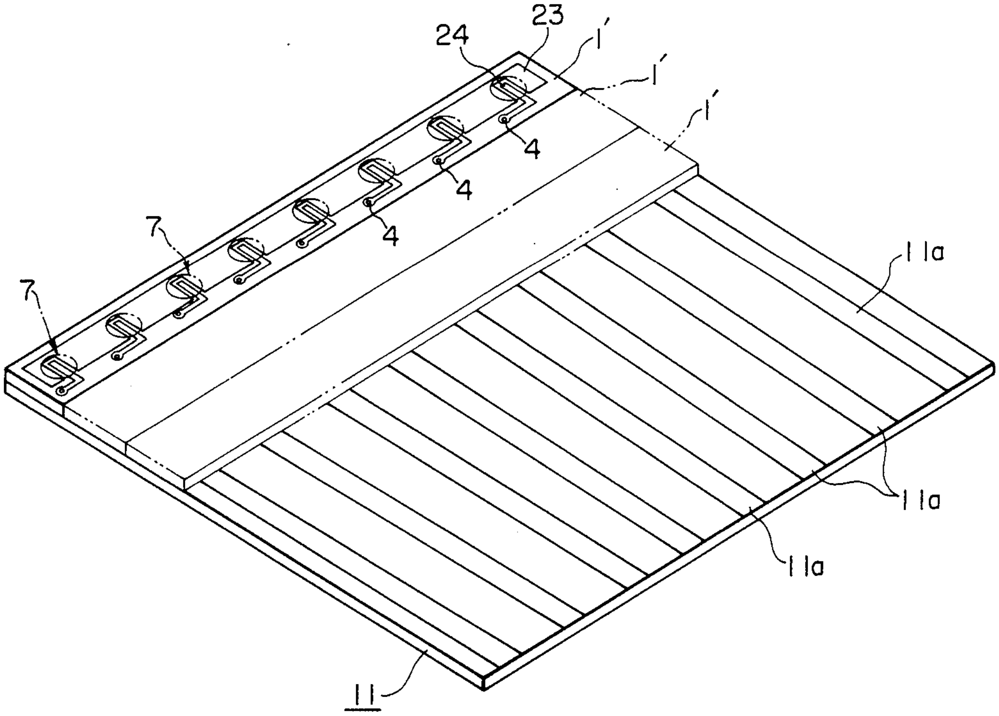
FIG. 13 is a perspective view illustrating another example of a display board to which the present invention is applicable.

The present invention is not limited to dot matrix luminous displays as described above and, as proposed in Japanese Patent No. 59-27606, is applicable to a plurality of display boards provided with luminous portions forming a body of segments. FIG. 13 illustrates such an embodiment.

Specifically, FIG. 13 shows an arrangement of a body of segments 1' provided with luminous portions 7 and an insulating board 11 carrying an electrode pattern 11*a*, wherein the electrode pattern portion 24 of the body of segments 1' is connected to the electrode pattern 11*a* via through-holes 105 provided in areas other than those (shown by alternating long and two dashed lines) corresponding to the through-holes 200 of the flexible plate 2. The flexible plate 2 has been omitted in FIG. 13.

I claim:

1. A dot matrix luminous display comprising: a dot matrix display board having a rigid insulating plate; first and second sets of electrodes provided on respective opposite surfaces of said insulating plate; a plurality of light emitting-elements on one surface of said plate and a plurality of through-holes in said plate through which said light emitting-elements are electrically coupled between said electrodes of said first and second sets, respectively; and a rubber elastic member which is flexible relative to said dot matrix display board, said rubber elastic member being provided over said one surface of said dot matrix display board, said rubber elastic member having a plurality of through-holes formed therein at locations corresponding to locations of said light-emitting elements, said through-holes in said member being filled with a thermosetting resin, wherein contraction of said thermosetting resin resulting from hardening of said thermosetting resin is absorbed by said rubber elastic member.

2. The luminous display of claim 1, wherein said through-holes in said insulating plate and said through-holes in said elastic member are offset from each other.

3. The luminous display of claim 1, wherein said electrodes of said first and second sets intersect at said through-holes in said insulating plate; at least one of said light-emitting elements being provided at each intersection of said electrodes of said first and second sets, and each of said light-emitting elements being electrically coupled to the intersecting ones of said electrodes of said first and second sets, said through-holes in said plate being filled with a resin.

4. The luminous display of claim 1, wherein one of said sets of first and second electrodes passes through said through-holes in said plate so as to electrically contact said light emitting elements on said one surface of said insulating plate where said light emitting elements and the other one of said sets of first and second electrodes are provided, said through-holes in said plate being filled with a resin.

5. The luminous display of claim 1, wherein said elastic member is made from a material selected from the group consisting of silicon rubber and neoprene rubber.

6. The luminous display of claim 1, wherein said elastic member is made of a heat resistant material.

7. The luminous display of claim 1, wherein said through-holes in said elastic member are filled with a translucent resin.

8. The luminous display of claim 4, wherein said resin is a thermosetting resin.

9. The luminous display of claim 1, wherein said insulating plate is a glass epoxy laminated plate.

10. The luminous display of claim 1, wherein said insulating plate is a paper phenol laminated plate.

11. The luminous display of claim 1, wherein inner walls of said through-holes in said elastic member are of a reflective color.

12. The luminous display of claim 3, wherein said insulating plate is a glass epoxy laminated plate.

13. The luminous display of claim 3, wherein said insulating plate is a paper phenol laminated plate.

14. The luminous display of claim 4, wherein said insulating plate is a glass epoxy laminated plate.

15. The luminous display of claim 4, wherein said insulating plate is a paper phenol laminated plate.

16. The luminous display of claim 3, wherein said resin is a thermosetting resin.

* * * * *